US011831128B2

(12) United States Patent
D'Errico et al.

(10) Patent No.: US 11,831,128 B2
(45) Date of Patent: Nov. 28, 2023

(54) ELECTRO-OPTICAL APPARATUS

(71) Applicant: Telefonaktiebolaget LM Ericsson (publ), Stockholm (SE)

(72) Inventors: Antonio D'Errico, Pisa (IT); Alessandra Bigongiari, Pisa (IT)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 98 days.

(21) Appl. No.: 17/599,819

(22) PCT Filed: Mar. 29, 2019

(86) PCT No.: PCT/EP2019/058032
§ 371 (c)(1),
(2) Date: Sep. 29, 2021

(87) PCT Pub. No.: WO2020/200402
PCT Pub. Date: Oct. 8, 2020

(65) Prior Publication Data
US 2022/0181847 A1    Jun. 9, 2022

(51) Int. Cl.
*H01S 3/08* (2023.01)
*H01S 5/10* (2021.01)
(Continued)

(52) U.S. Cl.
CPC .............. *H01S 5/1046* (2013.01); *H01S 4/00* (2013.01); *H01S 5/04254* (2019.08); *H01S 5/04256* (2019.08); *H01S 5/0607* (2013.01)

(58) Field of Classification Search
CPC ...... H01S 5/1046; H01S 4/00; H01S 5/04254; H01S 5/04256; H01S 5/0607
See application file for complete search history.

(56) References Cited

U.S. PATENT DOCUMENTS

2004/0108471 A1* 6/2004 Luo ........................... G01T 1/22
250/493.1
2004/0131102 A1* 7/2004 Jette ....................... B82Y 20/00
372/97
(Continued)

FOREIGN PATENT DOCUMENTS

CN        106569248 B      3/2019

OTHER PUBLICATIONS

Cabellos-Aparicio, Albert, et al., "Use of Terahertz Photoconductive Sources to Characterize Tunable Graphene RF Plasmonic Antennas", IEEE Transactions on Nanotechnology, vol. 14, No. 2, Mar. 2015, 390-397.
(Continued)

*Primary Examiner* — Kinam Park
(74) *Attorney, Agent, or Firm* — Murphy, Bilak & Homiller, PLLC (57) ABSTRACT

Embodiments described herein relate to methods and apparatus for generating electromagnetic radiation in an electro-optical apparatus. An electro-optical apparatus comprises a core region; a cladding region extending around the core region, and a first layer of a material extending along an interface between the core region and the cladding region, wherein the first layer is configured with a changing refractive index along at least a first direction; and a set of driving electrical contacts configured to apply a voltage in a second direction on the first layer, such that electrons in the first layer are accelerated between the set of driving electrical contacts to generate a surface polariton wave at the interface between the core region and the cladding region, wherein the surface polariton wave propagates in the first direction, and wherein a thickness of the first layer is less than an extinction length of the surface polariton wave in the material, and the first layer is positioned a distance less than or equal to the
(Continued)

extinction length of the surface polariton from the interface between the core region and the cladding region.

18 Claims, 7 Drawing Sheets

(51) Int. Cl.
  *H01S 5/042* (2006.01)
  *H01S 5/06* (2006.01)
  *H01S 4/00* (2006.01)

(56) References Cited

U.S. PATENT DOCUMENTS

| | | | | |
|---|---|---|---|---|
| 2006/0257090 | A1* | 11/2006 | Podolskiy | G02B 6/1226 385/11 |
| 2008/0265165 | A1* | 10/2008 | Yeh | H01S 1/02 250/341.1 |
| 2010/0158445 | A1* | 6/2010 | Kim | G02B 6/1226 385/130 |
| 2010/0226134 | A1* | 9/2010 | Capasso | H01S 5/1082 438/42 |
| 2014/0341496 | A1* | 11/2014 | Kim | G02F 1/011 430/321 |
| 2015/0188280 | A1* | 7/2015 | Hill | H01S 5/1064 359/341.1 |
| 2016/0227639 | A1* | 8/2016 | Kaminer | H05H 3/00 |
| 2019/0386453 | A1* | 12/2019 | Schmid | H01S 5/0422 |

OTHER PUBLICATIONS

Camacho-Aguilera, Rodolfo E., "An electrically pumped germanium laser", Optics Express, vol. 20, No. 10, 2012 Optical Society of America, May 2, 2012, 1-6.

Gorbachev, Roman V., et al., "Conductance of p-n-p Graphene Structures with "Air-Bridge" Top Gates", Nano Letters, vol. 8, No. 7, 1995-1999, 2008 American Chemical Society, Jun. 11, 2008, 1-5.

Hirai, Hideki, et al., "Electron mobility calculation for graphene on substrates", Journal of Applied Physics, vol. 116, 2014 AIP Publishing LLC, 2014, 1-7.

Ishii, Hiroyuki, et al., "Spectral Linewidth Reduction in Widely Wavelength Tunable DFB Laser Array", IEEE Journal of Selected Topics in Quantum Electronics, vol. 15, No. 3, May/Jun. 2009, 514-520.

Kaminer, Ido, et al., "Efficient plasmonic emission by the quantum Cerenkov effect from hot carriers in graphene", Nature Communications, 7, Article No. ncomms11880, Jun. 2016, 1-10.

Komljenovic, Tin, et al., "Widely Tunable Narrow-Linewidth Monolithically Integrated External-Cavity Semiconductor Lasers", IEEE Journal of Selected Topics in Quantum Electronics, vol. 21, No. 6, Nov./Dec. 2015, 1-9.

Liu, Weihao, et al., "Surface Polariton Cherenkov Light Radiation Source", Physical Review Letters, vol. 109, 2012 American Physical Society, Oct. 2012, 1-6.

Llatser, Ignacio, et al., "Graphene-based nano-patch antenna for terahertz radiation", Photonics and Nanostructures—Fundamentals and Applications, vol. 10, 2012 Elsevier B.V., 2012, 353-358.

Polischuk, Olga V., et al., "Plasmonic amplification of terahertz radiation in a periodic graphene structure with the carrier injection", Applied Physics Letters, vol. 111, AIP Publishing, 2017, 1-5.

Raether, Heinz, "Surface Plasmons on Smooth and Rough Surfaces and on Gratings", Springer-Verlag, Hamburg, Dec. 1986, 1-140.

Rickhaus, Peter, et al., "Guiding of Electrons in a Few-Mode Ballistic Graphene Channel", Nano Letters, pubs.acs.org/NanoLett, American Chemical Society, Aug. 20, 2015, 1-7.

Santis, Christos Theodoros, et al., "High-coherence semiconductor lasers based on integral high-Q resonators in hybrid Si/III-V platforms", PNAS, vol. 111, No. 8, Feb. 25, 2014, 2879-2884.

Schneider, Christian, et al., "An electrically pumped polariton laser", Nature, vol. 497, Nature Publishing Group, May 2013, 1-20.

Watanabe, Takayuki, et al., "The gain enhancement effect of surface plasmon polaritons on terahertz stimulated emission in optically pumped monolayer graphene", New Journal of Physics, vol. 15, Jul. 3, 2013, 1-12.

Harris, Edward, G., "A Pedestrian approach to quantum field theory", John Wiley & Sons, Inc., New York, 1972, pp. 32-34, 66-68.

* cited by examiner

Apply a voltage in a second direction on the first layer, such that electrons in the first layer are accelerated between the set of driving electrical contacts to generate a surface polariton wave at the interface between the core region and the cladding region, wherein the surface polariton wave propagates in the first direction. ⎯1201

Fig. 12

ELECTRO-OPTICAL APPARATUS

TECHNICAL FIELD

Embodiments described herein relate to an electro-optical apparatus and a method of manufacture of the same. In particular, an electro-optical apparatus is described in which surface polaritons are generated at an interface between core and cladding regions of the electro-optical apparatus in order to generate electromagnetic radiation with an efficient and effective design.

BACKGROUND

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

Conventional lasers rely on stimulated emission of photons having a threshold electrical energy level for their operation and a resonating cavity to convey the electrical energy on an optical wavelength. The fundamental mechanism behind laser action leads in general to narrowband, single-wavelength emission, in other words laser action enhances lasing coherence. In conventional Distributed Feedback (DFB) lasers, the coherence of the source may be estimated from the lasing line-width and may be few MHz. With conventional external cavity lasers, the linewidth may be measured to be few kHz.

The coherence of a laser may be crucial when performing broadband transmissions or when generating very short light pulses having. In particular, the coherence of a laser may have an enormous importance in the field of telecommunications and monitoring, respectively.

The coherence of emitted light depends on the thermal and mechanical stability of the resonating cavity and the noise generated by the electrical circuitry driving the stimulated emission process.

Alternatives have been proposed to find a better way to produce coherent light. The most coherent approaches are those realizations using electrically pumped polariton surface lasers. For example some solutions are based on a microcavity containing multiple quantum wells exhibiting a much lower energy threshold with respect to conventional lasers at industrial application temperatures.

However, this approach is still complex and the actual scheme for polariton surface wave lasers is not practical for CMOS integration on silicon, and cannot therefore be used to target high volume of production of laser electromagnetic radiation for telecommunication network segments in Information Communication Technology or other applications linked with connections like sensors.

It may be desirable to perform reliable confinement of light while limiting the impact of the confinement mechanisms on the operative performance of the signal coupling of the laser with a photonic waveguide. This aspect may be valid both for light propagation in the waveguide and in light coupling with photonic connectors, typically positioned at the photonic chip ends. New photonic lasers may therefore be desirable which have high energy efficiency and simple structures.

To be efficient and compatible with standard CMOS process, the full integration of a laser on a silicon die is necessary. Current proposed solutions offer the integration of a laser by growing the needed active lasing device on a silicon substrate. There has been a tentative approach based on the use of Germanium material, which can be grown on a silicon surface, but the realization required to much doping of the material making this solution not sustainable for commercial purposes.

In optics, light generation and coupling with the allowed propagation mode in a waveguide (i.e. photonic waveguide on silicon substrate or optical fiber) may be implemented by proper photonic design for the realization of a dedicated optical path to confine light avoiding leakage. Possibilities are based on the use of optical lenses, butt, tapering and grating coupling techniques. All the above options suffer from not being compatible with standard CMOS integration of a laser over a silicon photonic chip.

In particular, some configurations of an optical circuits may not allow for efficient light confinement due to physical dimensions compatibility or a lack of proper refractive index step change without affecting the system structure and/or reducing system performance. Unfortunately, current approaches introduce unwanted optical losses (e.g. due to scattering of an optical beam out of the waveguide or optical fiber) generating the need for an optical power supply chain for allowing the electromagnetic waves still propagating in the system to recover from the unwanted leakage. Leveraging on current state of the art, the higher the number of power recovering devices (e.g. optical amplifiers or optical lenses) and the higher the complexity of the designed optical circuitry is, the lower the reliability and performance of the overall system.

On the other hand, optical lasers may be optimized to work with high coupling beams whilst introducing the lowest possible loss or leakage in the misalignment. Truly photonic integrated lasers should be designed to have very small footprint, with no power supply or biasing circuitry or impedance adaptation.

Not least, current solutions for laser sources suffer from harsh environment operative conditions. For instance, when laser sources are mounted on antennas working with high temperature variation range, they have to be continuously monitored and thermally controlled and stabilized to avoid performance degradations in light generation. Degradations can be ascribed to the possible unwanted variations of those physical parameters affecting the stimulated emission: refractive index variation in the gain medium, current threshold deviation versus temperature range, which affect light generation coherence and launched power. In other words, the laser can suffer from wavelength instability, phase and intensity noise.

SUMMARY

According to some embodiments there is provided an electro-optical apparatus for generating electromagnetic radiation. The electro-optical apparatus comprises a core region; a cladding region extending around the core region, and a first layer of a material extending along an interface between the core region and the cladding region, wherein the first layer is configured with a changing refractive index along at least a first direction; and a set of driving electrical contacts configured to apply a voltage in a second direction on the first layer, such that electrons in the first layer are accelerated between the set of driving electrical contacts to generate a surface polariton wave at the interface between the core region and the cladding region, wherein the surface polariton wave propagates in the first direction, and wherein a thickness of the first layer is less than an extinction length of the surface polariton wave in the material, and the first layer is positioned a distance less than or equal to the extinction length of the surface polariton from the interface between the core region and the cladding region.

According to some embodiments there is provided a method of generating electromagnetic radiation in an electro-optical apparatus comprising a core region; a cladding region extending around the core region, and a first layer of a material extending along an interface between the core region and the cladding region, wherein the first layer is configured with a changing refractive index along at least a first direction. The method comprises applying a voltage in a second direction on the first layer, such that electrons in the first layer are accelerated between the set of driving electrical contacts to generate a surface polariton wave at the interface between the core region and the cladding region, wherein the surface polariton wave propagates in the first direction, and wherein a thickness of the first layer is less than an extinction length of the surface polariton wave in the material, and the first layer is positioned a distance less than or equal to the extinction length of the surface polariton from the interface between the core region and the cladding region.

BRIEF DESCRIPTION OF THE DRAWINGS

For a better understanding of the present embodiments, and to show how they may be put into effect, reference will now be made, by way of example only, to the accompanying drawings, in which.

DESCRIPTION

Some of the embodiments contemplated herein will now be described more fully with reference to the accompanying drawings. Other embodiments, however, are contained within the scope of the subject matter disclosed herein, the disclosed subject matter should not be construed as limited to only the embodiments set forth herein; rather, these embodiments are provided by way of example to convey the scope of the subject matter to those skilled in the art.

Figure 1:
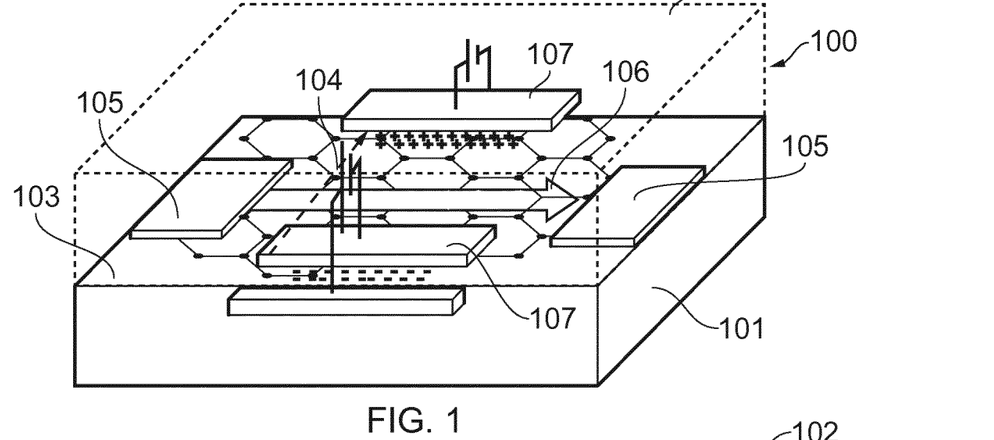
FIG. 1 illustrates an electro-optical apparatus 100 for generating electromagnetic radiation according to some embodiments.

FIG. 1 illustrates an electro-optical apparatus 100 for generating electromagnetic radiation. In particular, the electro-optical system may be used in conjunction with an optical waveguide to generate light and transmit light in a telecommunications system. The electro-optical apparatus 100 may be configured to apply an intrinsic optical gain for light generation through electric carrier injection only and not by optical pumping or electrical pumping as in the current state of the art.

In some embodiments the generation of the electromagnetic radiation may be performed by the electro-optical apparatus 100 by generating a surface polariton wave via quantum Cherenkov radiation along a bi-dimensional material, for example graphene or any other suitable metamaterial, that is positioned at or near to an interface between a core region and a cladding region of the electro-optical apparatus. In some aspects, the bi-dimensional material may be considered as a material having one of its dimensions being very small compared to its other two dimensions, such that the material has different physical properties in the small dimension compared to its larger dimensions.

In the example illustrated in FIG. 1, the electro-optical apparatus 100 comprises a core region 101 and a cladding region 102. The cladding region 102 may be configured to extend around the core region 101.

In some examples, the cladding region may extend around a circular sector of the core region such that the core region may be configured to confine electromagnetic radiation within the core region, and the electromagnetic radiation may then travel through the core region along a circular sector radius. The cladding region 102 may comprise silicon dioxide or any other suitable cladding material. The core region 101 may comprise silicon, or any other suitable light guiding material.

The electro-optical apparatus 100 further comprises a first layer 103 of a material, wherein the first layer 103 is configured with a changing refractive index along at least a first direction 104. The first layer may be positioned at, or near to, an interface between the core region 101 and the cladding region 102. In some examples, the changing refractive index along the at least first direction 104 comprises a periodic refractive index, as will be described later with reference to FIG. 6. The first layer 103, e.g. graphene, may be defined as a bi-dimensional material instead, or in addition to, a definition including penetration length depth or extinction length.

The electro-optical apparatus 100 comprises a set of driving electrical contacts 105 configured to apply a voltage in a second direction 106 on the first layer 103, such that electrons in the first layer 103 are accelerated between the set of driving electrical contacts 105 to generate a surface polariton wave at an interface between the core region 101 and the cladding region 102. The surface polariton wave may propagate in the first direction 104, and may be generated by Cherenkov radiation.

Classical Cherenkov radiation is observed when charged particles (generally electrons) travel through a medium at a speed that is faster than the phase speed of light in the medium. This is possible for energetic electrons in a medium having a high refractive index n, since the phase velocity is $v_{phase}=c/n$ in a medium.

The range of electron energies for which we have Cherenkov radiation may be expressed as:

$$c > v_e > c/n \quad (1)$$

Classical Cerenkov radiation is a particular case of a more general emission process in which an electron is travelling too fast to allow the surrounding medium to respond to its passage, which causes the emission of a photon.

However, a more rigorous expression of the range of allowed electron velocities for Cherenkov radiation may be obtained. The calculation shows a range of electron energies for which Cherenkov radiation may be generated such that conduction electrons in graphene (and other 2D materials with similar electro-optical properties) may generate Cherenkov radiation. This allows the electrons to be accelerated by an integrated source. As such it is not necessary to accelerate the electrons via an external source, i.e an external source which is not integrated or not microscopic is not required. In other words, the electrons producing Cherenkov radiation may be generated by applying a moderate voltage (from few mV to 1V) to a layer of graphene (or a material with similar characteristics) integrated in silicon photonics with a specific design.

The thickness of the first layer 103 may be less than an extinction length of the surface polariton wave in the material. This is so that the material of the first layer 103 does not perturb the boundary conditions at the interface between the core region 101 and the cladding region 102. If the boundary conditions at the interface were altered by the presence of the first layer 103, the radiation would not be able to be transferred into the core region 101 to propagate as light within the core region.

The extinction length may be the distance from interface at which the intensity of the polariton is such that the material of the first layer is not affected by the field of the polariton surface wave. For example, the extinction length may be the distance from interface at which the intensity of the surface polariton wave drops by for example 90-95% with respect to the maximum intensity of the surface polariton wave. The extinction length of the surface polariton wave in a direction depends on the medium crossed by the surface polariton wave along that direction and may be estimated as polariton wavelength over the refraction index of the medium.

The first layer 103 may be positioned a distance less than or equal to the extinction length of the surface polariton from the interface between the core region 101 and the cladding region 102. This positioning of the first layer 103 is performed so that the first layer is capable to excite the surface polariton wave at the interface via electron acceleration and to amplify the surface polariton wave as will be described below.

To use the electro-optical apparatus 100 to generate electromagnetic radiation, first a desired emission frequency, ω, for the generated surface wave polariton is chosen; all other parameters that are used to pilot the electro-optical apparatus 100 may depend on the desired emission frequency, ω. The desired emission frequency may be selected to match the frequency of desired electromagnetic radiation to be transferred into the core region 101, as will be described later.

The wavelength λ of the polariton surface wave is determined based on the selected frequency ω and the electro-optical properties of the core region 101, the cladding region 102 and the first layer 103 according to the relationship $$\frac{\epsilon_1}{\sqrt{k^2 - \frac{\epsilon_1 \omega^2}{c^2}}} + \frac{\epsilon_2}{\sqrt{k^2 - \frac{\epsilon_2 \omega^2}{c^2}}} = -\frac{i\sigma(\omega, k)}{\omega \epsilon_0} \quad (2)$$

Where k is the wave vector of the surface polariton wave ($k=2*\pi/\lambda$), $\epsilon_1$ and $\epsilon_2$ are the dielectric constants of the core region 101 and cladding region 102 materials respectively, σ is the dynamic conductivity of the first layer 103, ω is the frequency of the surface wave polariton and $\epsilon_0$ is the dielectric constant of vacuum.

For applications in a silicon photonics waveguide, the refractive index may be $n_1=3.5$ in the core region 101 and $n_2=1.2$ in the cladding region 102, with $\epsilon_i=n_i^2$.

The propagation velocity $v_p$ of the surface polariton wave may depend on the solution of equation (2), where k is the unknown variable to be found as a function of the frequency ω and the materials parameters σ and $\epsilon_{1,2}$. The propagation velocity of the resulting surface polariton may be obtained from k according to the equation:

$$v_p = \frac{\omega}{\kappa} \quad (3)$$

Electrons may be accelerated in the first layer 103 via the set of driving electrodes 105 such that the direction of their drift velocity is defined and constant within a given precision.

The polariton surface wave may then be emitted via quantum Cerenkov radiation when the electron reaches a velocity that meets the condition for the emission of a polariton surface photon of the selected frequency, ω.

The conditions for the emission of a polariton surface are:

$$v < v_{p'} |\cos \theta_c| < 1, \text{ where} \quad (4)$$

v is the velocity of the electron, and $\theta_c$ is the angle between the electron drift direction and the polariton surface wave propagation direction.

These conditions set the range of electron drift velocities, v, for which the polariton surface is emitted:

$$v_p > v > v_p\left(1 - \frac{\hbar \omega}{2E_i}\right) \quad (5)$$

where $\hbar$ is plank's constant, and $E_i$ is the electron energy.

The propagation direction of the polariton surface wave with respect with the electron drift direction is determined by the electron energy $E_i$ according to the equation:

$$\cos\theta_C = \frac{v_p}{v}\left[1 - \frac{\hbar\omega}{2E_i}\left(1 - \frac{v^2}{v_p^2}\right)\right] \quad (6)$$

The Cherenkov radiation excitation method therefore consists of applying a voltage so as to provide electrons in the desired energy range which will generate the surface polariton wave.

Figure 2:
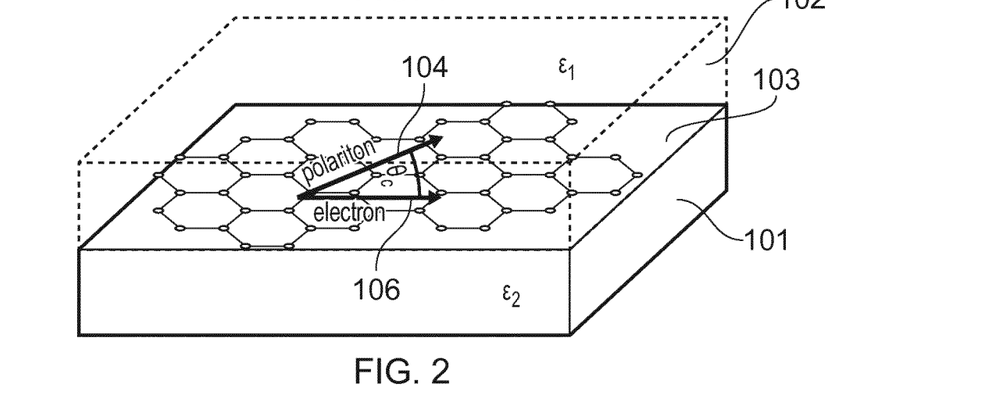
FIG. 2 illustrates the electron drift direction and the surface polariton wave direction in an electro-optical apparatus.

FIG. 2 illustrates the electron drift direction 106 and the surface polariton wave direction 104.

Both directions lie on the first layer 103 plane. The driving electrons belong to the conduction electrons of the first layer 103 and the emitted radiation is bound to propagate as a surface polariton wave along the interface between the core region 101 and the cladding region 102. The continued propagation of the surface polariton wave may be obtained by matching the momentum of the emitted surface polariton wave with the boundary conditions for the excitation of a surface polariton wave as characterized by equation (2).

Figure 3:
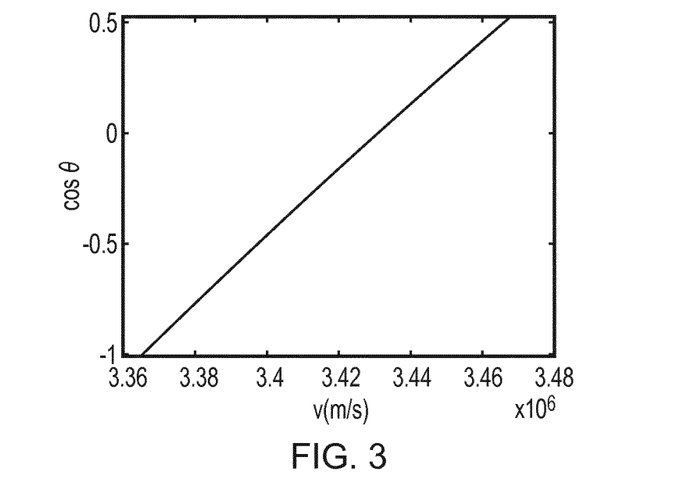
FIG. 3 illustrates the emission angle as a function of drift velocity for a selected frequency.

Equation (6) illustrates that the angle of emission, $\theta_c$, depends on 3 parameters 1) the selected frequency 2) the velocity of propagation of the polariton surface, which depends on the selected frequency and the materials at the interface according to equations (2) and (3) and 3) the electron drift velocity. FIG. 3 illustrates the emission angle as a function of drift velocity for a selected frequency.

Equation (5) illustrates that there is a range of electron drift velocities that allow the emission of a surface polariton wave of given frequency and wavelength. Each electron drift velocity within the range may emit a surface polariton wave of the same frequency and wavelength in a different direction. The information relating to the polariton surface wavelength is included in the polariton surface velocity $v_p = \omega/k = \omega\lambda/2\pi$.

The rate of emission may be calculated according to equation:

$$\Gamma = \frac{2\pi}{\hbar}\left(\frac{e}{mc}\right)^2\left(\frac{4\pi\hbar}{\Omega\frac{\partial}{\partial\omega}k(\omega)}\right)(1 - \cos^2\theta_C) \quad (7)$$

The rate of emission corresponds to the number of surface polariton waves that are emitted in a second by electrons in a portion of the first layer 103 of size Ω (where Ω is the size of the 2 dimensional surface of the first layer). The rate of emission can be calculated for different values of the frequency and wavelength of the polariton surface wave and the electron drift velocity, as illustrated in FIG. 4.

Figure 4:
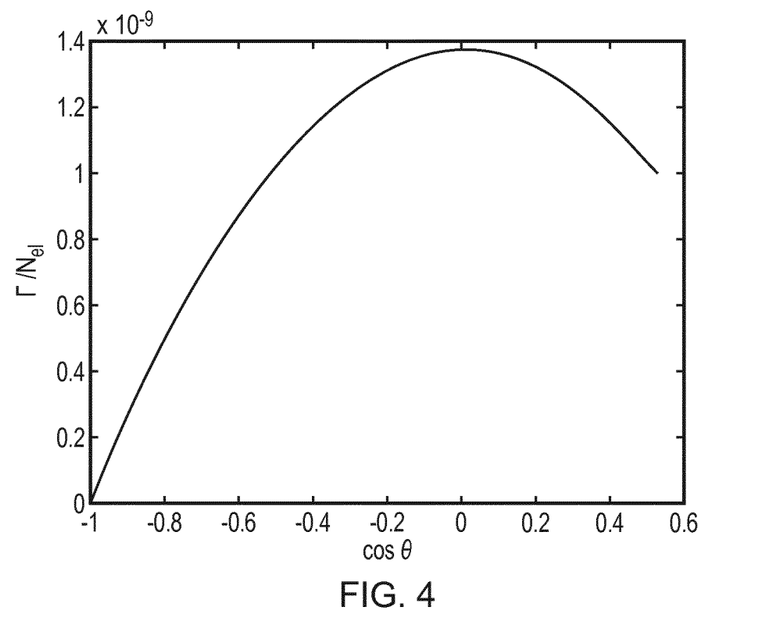
FIG. 4 illustrates the rate of emission as a function of emission angle.

As can be seen from FIG. 4, the most probable angle of emission is for $\cos(\theta_c)=0$. In other words, in some examples, the most probable angle of emission is 90 degrees from the direction of the drift velocity of the electrons.

The emission probability may be expressed as:

$$\Gamma = \frac{2\pi}{\hbar\Omega\frac{\partial}{\partial\omega}k(\omega)}\left(\frac{e}{mc}\right)^2 \langle q-k|u\cdot p\cdot A|q\rangle = \quad (8)$$

-continued
$$\frac{2\pi}{\hbar\Omega\frac{\partial}{\partial\omega}k(\omega)}\left(\frac{e}{mc}\right)^2 \langle q-k|u*pe^{-ikx}|q\rangle$$

Where p is the momentum operator for the surface polariton wave and u is a unit polarization vector, representing the polarization state of the EM wave (TM or TE).

The quantity $\langle q-k|u\cdot p\cdot A|q\rangle$ gives the probability of the emission of a surface polariton wave of momentum k from an electron with momentum q, interacting with the field A in a medium, where the interaction of the field with the medium may be described by the dielectric function $\epsilon(k,\omega)$. For wavelengths that are much larger than the atomic scale (e.g. $\lambda > 10^{-10}$m), we can approximate the exponential as $1-kx+0.5(kx)^2$. In an approximation known as the dipole approximation, only the first term (equal to 1) is retained.

The allowed values of the momentum of the electron may be such that energy is preserved. For a non-relativistic electron (which corresponds to the condition of the proposed invention) this means that:

$$\frac{q^2}{2m} - \frac{(q-k)^2}{2m} - \hbar\omega = 0 \quad (9)$$

Where $$E_i = \frac{q^2}{2m}$$

is the energy of the electron. Equation (9) also gives the condition for the emission of quantum Cerenkov radiation, since equation (9) can be rewritten as:

$$2qk\cos\theta_C - 2m\hbar\omega - k^2 = 2mv\frac{\omega}{v_p}\cos\theta_C - 2m\hbar\omega - \frac{(\hbar\omega)^2}{v_p^2} = 0$$

Which gives equation (6) and, by imposing $|\cos\theta_c|>1$, the energy range in equation (5).

The result for the rate of emission Γ is shown in equation (7) as a function of the relative angle between the surface polariton wave of momentum k and the electron of momentum p.

The rate of emission may be calculated per unit electron, for an emitting surface of $\sim 10^4$ nm². In order to obtain the total rate, the product between the rate of emission per unit electron and the number of electrons $N_{el}$ that travel between the electrodes per second may be calculated.

For example, for a literature value of electron density in un-doped graphene of $10^{-2}$ electrons per nm², if we consider an electron channel of sub-micrometric width w=100 nm, and a sub-micrometric distance d=100 nm between the driving electrodes the number of electrons available is $N=10^2$. Since the desired electron velocity is of the order of $v \sim 10^6$ m/s, and the travel time can be estimated as $t \sim 10^{-13}$ s, then the number of electrons travelling between the electrodes in a second is $N_{el}=10^{15}$. Using these parameters, the total emission rate can be estimated as Γ=$10^6$.

The emission of the surface polariton wave by Cherenkov radiation may then be used to generate electromagnetic radiation of the same frequency within the core region 101 of the electro-optical apparatus. However, for this to occur the momentum of the surface polariton wave may be required to match the momentum of electro-magnetic radiation of the same frequency propagating in the core region 101 of the electro-optical apparatus.

Figure 5:
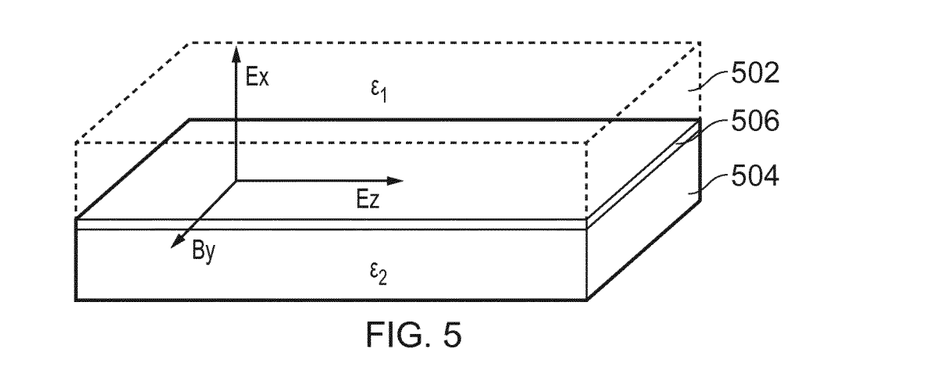
FIG. 5 illustrates two regions and with respective refraction indexes $\varepsilon_1$ and $\varepsilon_2$ that are separated by a contact interface.

For example, as illustrated in FIG. 5 two regions 502 and 504 with respective refraction indexes $\varepsilon_1$ and $\varepsilon_2$ are separated by a contact interface 506 and a magnetic field is parallel to the contact interface 506. It will be noted that in this example, the polarization is defined with respect to the interface where the surface wave propagates. This differs from the common definition of the polarization in a waveguide where the polarization is always defined with respect with the surface that is parallel to the largest surface (horizontal) of the substrate (e.g. silicon on insulator substrate).

This means that in a waveguide designed for Transverse-Electric (TE) mode the interfaces where the surface polariton wave can propagate are the side walls, whereas in a waveguide designed for Transverse-Magnetic (TM) the interfaces where the surface polariton wave can propagate are the ceiling and floor surfaces.

The electric field in the direction perpendicular to the contact interface 506 may be given by:

$$E_x = e^{-q1x}e^{ikz-i\omega t}H(x) + e^{q2x}e^{ikz-i\omega t}H(-x)$$

Where $H(x)$ is the Heaviside step function, $kz=2\pi/\lambda$ is the wave vector of the electromagnetic radiation parallel to the interface, $\omega$ is the angular frequency of the wave, t is time, and q (i=1; 2) are the evanescence lengths in the two regions 502 and 504 respectively (in this notation both k and q are real valued).

$$q_i = \sqrt{k^2 - \frac{\epsilon_i \omega^2}{c^2}} \quad (10)$$

Applying Maxwell's equations, the following is obtained:

$$E_{1x} = -\frac{kc}{\omega\epsilon_1}B_y$$

$$E_{2x} = -\frac{kc}{\omega\epsilon_2}B_y$$

$$E_{1z} = -\frac{q_1 c}{\omega\epsilon_1}B_y$$

$$E_{2z} = \frac{q_2 c}{\omega\epsilon_2}B_y,$$

for the electric fields in the two materials in the x and z directions. Without a first layer near to or at the contact interface, the matching relationship is found by imposing the continuity of the electric field along the surface $E_{1z}=E_{2z}$.

$$\frac{q_1}{q_2} = -\frac{\epsilon_1}{\epsilon_2}$$

However, for the example illustrated in FIG. 1 when a first layer 103, for example graphene, is present close to or at the interface between two regions 101 and 102, the resonance condition is modified to include the effects of surface currents graphene expressed through its dynamic conductivity, as illustrated in Equation (2).

For example, for a silicon photonics waveguide, where the core region comprises silicon having a refractive index is $n_1=3.5$, and the cladding region comprises silicon dioxide having a refractive index of $n_2=1.2$ wherein the dielectric constant is given by $\epsilon_i=n_i^2$.

Equation (2) may therefore give the resonance condition for a surface polariton wave in the first layer 103 at the contact interface 506. For example, for $\sigma=0$, $n_1=3.5$ and $n_2=1.2$ the resonance condition results in a predicted wave-vector for a surface polariton wave in the graphene layer of $$k = k_s = 1.13\frac{\omega}{c},$$

where $k_s$ is the value k of the solution of the equation (2) above.

However, as previously mentioned, to efficiently convert the generated surface polariton wave into electromagnetic radiation in the core region of the same frequency, the momentum of the surface polariton wave has to match the momentum of electromagnetic radiation of the same frequency, w, propagating in the core region 101.

In other words, the momentum of the generated surface polariton wave may be required to equal the momentum of electromagnetic radiation in the core region, where the momentum of the electromagnetic wave in the core region can be calculated from the equation:

$$k_c = n_1 \frac{\omega}{c} \quad (11)$$

So, for the above example where $n_1=3.5$, $$k_c = 3.5\frac{\omega}{c}.$$

Without a changing refractive index, the surface wave at the interface between the core region 101 and the cladding region 102 would not match the momentum of the electro-magnetic radiation in the core region 101 and would therefore not convert into electromagnetic radiation in the core region 101.

Therefore, in order to match the momentum of the generated surface polariton wave to the desired electromagnetic radiation in the core region 101 additional momentum may be added to the surface polariton wave.

In some examples, this additional momentum may be provided by adding a changing refractive index variation along the first layer 103. In some examples the changing periodic refractive index may comprise a periodic refractive index. However, it will be appreciated that only one period may be required.

The periodic refractive index may provide a similar effect to a Bragg grating and may increase the momentum of the surface polariton wave to:

$$k'_{s,1} = \left(k_{s,1} + \frac{\omega m \lambda}{c a_{mod,1}}\right) = k_c, \quad (12)$$

where $a_{mod}$ is the period of the modulation of the refractive index, m is an integer value, $\omega$ is the frequency of the radiation propagated through the core region, and $\lambda$ is the wavelength of the radiation that is propagated in the core region. As the values of $k_c$ and $k_{s,1}$ can be calculated as described above with relation to equations (2) and (11), based on the properties of the materials forming the waveguide, an appropriate value for the period of the modulation of the refractive index $a_{mod}$ can be calculated from equation (12), where ω is the frequency of the radiation that is propagated in the waveguide core (in telecommunication these are given by an ITU grid, e.g. 191.15 to 196.10 THz for the C-band) and λ is the wavelength of the radiation that is propagated in the waveguide core. Thus, the periodicity $a_{mod}$ of the changing refractive index may be calculated using the above features and principles.

It will be appreciated that the electro-optical apparatus may be configured to only generate a surface polariton wave of an appropriate frequency and momentum such that the electro-optical apparatus may then be coupled to a waveguide which may propagate the surface polariton wave and/or transfer the energy of the surface polariton wave into the desired electromagnetic radiation propagating in a core region of the waveguide. Therefore, the electro-optical apparatus may therefore be configured with a changing refractive index which is enough to generate the surface polariton wave with the appropriate momentum.

In the example illustrated in FIG. 1, the changing refractive index in the first layer 103 is introduced using periodic carrier density variations. In particular, in this example, the electro-optical apparatus 100 comprises a first set of electrical contacts 107 positioned to locally electrostatically dope the first layer 103 to generate the periodic variable refractive index in the first layer 103. A voltage may be applied to the first set of electrical contacts 107 to electrostatically dope the first layer 103, for example, the voltage may be lower than 1.5 Volts. The first set of electrical contacts 107 may comprise standard metal contacts (for example, Tungsten, Titanium, Palladium, Gold or even Copper).

In this example therefore, the first set of electrical contacts 107 may be positioned such that $a_{mod,1}=d_1+2l_1$ where $d_1$ is a distance between two adjacent contacts of the first set of electrical contacts and $l_1$ is a width of a contact in the first set of electrical contacts.

Figure 6:
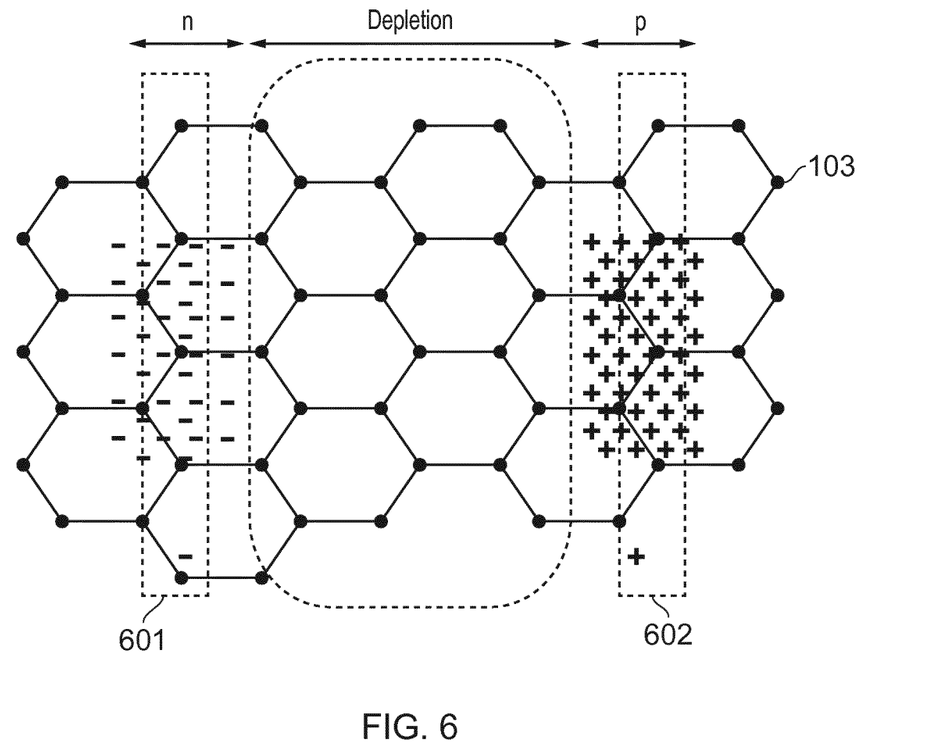
FIG. 6 illustrates a pn junction realized by electrostatic doping of a layer of graphene.

In this way, by applying a voltage across the two adjacent electrical contacts in the first set of electrical contacts 107, the electrical contacts 107 may introduce periodic carrier density variations, as illustrated in FIG. 6. FIG. 6 illustrates a pn junction realized by electrostatic doping of a layer of graphene.

It will be appreciated, that two adjacent electrical contacts, for example electrical contact 601 and electrical contact 602, are oppositely biased.

As can be seen, at the location of the negatively charged contact 601 the n region of the pn junction is generated. Equivalently, at the location of the positively charged contact 602 the p region of the pn junction is generated.

A repetition of this arrangement of negative and positive adjacent contacts along the first layer 103, may provide the periodic refractive index modulation as described in equation (12). In some examples, a single negatively charged contact 601 and a single positively charged contact 602 may be provided on the first layer 103 in the electro-optical apparatus 100. The single negative and single positive contact may be enough to adjust the momentum of the generated surface polariton wave to match electromagnetic radiation of the same frequency propagating in the core region. The electro-optical apparatus 100 may then be coupled to a waveguide which may continue the periodic refractive index of the first layer. In some examples, the electro-optical apparatus further comprises the waveguide.

When the periodicity of the refractive index along the first layer 103 is disrupted, the surface polariton wave can no longer propagate as the momentum of the surface polariton wave will no longer match with the resonance momentum of the first layer 103. In these circumstances, due to the boundary conditions of the core region 101 and the cladding region 102, the energy contained in the surface polariton wave is transferred into an electromagnetic wave of the same momentum and same frequency in the core region 101.

As illustrated above with reference to FIG. 2, the direction of the surface polariton wave may be dependent on the direction of the electron drift velocity, and may be controlled through the electron energy for a specific frequency and given materials parameters. The kinetic energy of an electron accelerated in a voltage drop depends on the mobility of material of the first layer. The mobility of the graphene for example, is in the order of $10^3 V^{-1} cm^2 s^{-1}$ to $10^4 V^{-1} cm^2 s^{-1}$ for a SiO2 substrate, and can be more than one order of magnitude higher using substrates such as boron nitride. The main limiting factor for mobility of graphene on substrate is, at present, charge impurity scattering, followed by phonon scattering.

However, the direction of the electron can vary on the graphene layer due to collisions. Depending on the application we might want a specific direction of emission of the surface polariton wave, for example, the direction of the emission of the surface polariton wave may preferably be in the direction of the changing refractive index of the first layer, for conversion into directional free space or guided optical radiation.

Figure 7:
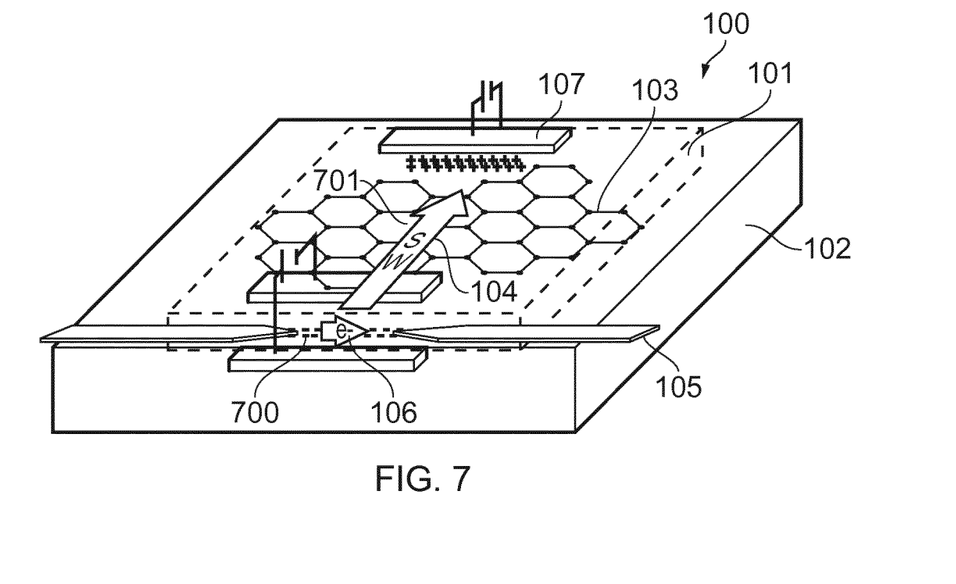
FIG. 7 illustrates an example of an electro-optical apparatus in which electron guiding is performed according to some embodiments.

FIG. 7 illustrates an example of an electro-optical apparatus 100 in which electron guiding is performed.

Electron guiding may be achieved through guiding of the electrons in the first layer 103. Electron guiding may be obtained via doping, where the carrier concentration is used as a refractive index. Depletion regions act as a reflective wall for the electrons that are accelerated through the n doped area. In this example the driving electrical contacts 105 are positioned so as to accelerate the electrons through an n doped region 700 in the first layer. In particular, the n doped region 700 may be the n doped region created by the first set of electrical contacts 107 that are providing the changing refractive index, as described above.

The depletion region 701 in the first layer 103 which is adjacent to the n doped region 700 acts as a reflective wall for the electrons, ensuring that the electrons are acceleration through the n doped region.

Alternatively, it is possible to accelerate electrons over a distance that is shorter than the mean free path; this in principle will reduce the emitting area. In other words, the distance between the set of driving electrical contacts may be less than the mean free path of the electrons. The fabrication tolerances allow the fabrication of slots having a size down to 10 nm, as indicated in the Technology roadmap for semiconductors. For the case of graphene on $SiO_2$ the mean free path is of the order of 100 nm.

However, we expect the emission point to be localized to the point where the electron reaches the energy that is necessary for Cherenkov radiation. This emission point may happen at a range of energies described by the rate equation (Equation (8)), which entails a corresponding spread in the emission angles. However, the position of the first set of electrical contacts may mean that only one direction of the emitted surface polariton waves will have a momentum that matches a desired electromagnetic radiation in the core region 101.

It may be desirable to for the driving electrical contacts 105 to be thin in order to control the emission direction (i.e. to control the emission to be in the direction perpendicular to the electrodes), and to improve the coherence of the emitted radiation and reduce eventual phase noise. In current CMOS fabrication technology, the driving electrical contacts 105 may have a width as small as 10 nm.

However, when using smaller driving electrical contacts 105 the rate of emission has a lower intensity which may then need amplification. A depletion region in the first layer 103 may provide such amplification through its negative conductivity, as will be described below.

Figure 8:
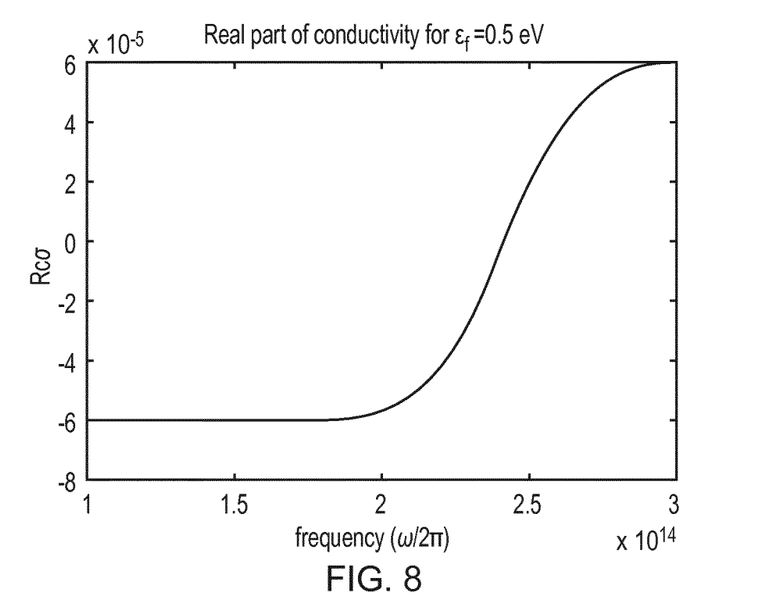
FIG. 8 illustrates the real part of the conductivity of graphene in a depletion region.

FIG. 8 illustrates the real part of the conductivity of graphene in a depletion region. As can be seen from this graph, the real part of the conductivity of graphene becomes negative at around $2.4 \times 10^{14}$ Hz.

The dynamic conductivity $\sigma_g$ of the inverted graphene (depletion region) may be given by two terms. The first term is the conductivity related to the intra-band transition contribution $\sigma_{intra}$, the remaining term correspond to the inter-band transition contribution $\sigma_{intra}$, which is related to the population inversion.

For example, the dynamic conductivity $\sigma_i$ of the inverted graphene may be given by:

$$\sigma_i = \frac{2e^2 k_B T \tau}{\pi \hbar^2 (1 - i\omega\tau)} \ln[1 + \exp(\varepsilon_F / k_B T)] + \qquad (13)$$

$$\frac{e^2}{4\hbar} \tanh\left(\frac{\hbar\omega - 2\varepsilon_F}{4 k_B T}\right) - \frac{e^2 \omega}{i\pi} \int_0^\infty \frac{G(\varepsilon, \varepsilon_F) - G(\hbar\omega/2, \varepsilon_F)}{(\hbar\omega)^2 - 4\varepsilon^2} d\varepsilon$$

Where $$G(\varepsilon, \varepsilon_F) = \frac{\sinh(\varepsilon/k_B T)}{\cosh(\varepsilon/k_B T) + \cosh(\varepsilon_F/k_B T)}.$$

In equation (13) $\omega$ is the angular frequency of the incoming radiation, $\varepsilon$ is the energy state integration variable, $\varepsilon_F$ is the Fermi energy, $\tau$ is the intra-band carrier relaxation time of graphene, which is estimated as $10^{-12}$ s for room temperature. T is the local temperature, $\hbar$ is the reduced Planck constant and $k_B$ the Boltzmann constant.

In other words, when a suitable voltage is applied to the graphene layer, the graphene is in population inversion where electrons are in the conduction band whilst holes are present in the valence band. These conditions allow for stimulated emission of further surface polariton waves due to the incident electromagnetic radiation of the generated surface polariton waves from the Cherenkov radiation. By holding the graphene in depletion by applying a voltage, the graphene remains in population inversion, and the stimulated emission can continue to occur.

The real part of the inter-band contribution may therefore be negative and may be larger than the real part of intra-band contribution, so to give an overall negative conductivity. The negative real part of the conductivity corresponds to amplification of the incoming Cherenkov radiation, whereas positive real part corresponds to absorption of the incoming Cherenkov radiation.

The dynamic conductivity of graphene in the depletion region may be controlled through the voltage bias value applied to the first set of electrical contacts, which determines a change in the Fermi energy level of the carriers. It will be appreciated, that graphene is given here as an example material for the first layer 103, and that the first layer 103 may comprise any other material which exhibits properties allowing for similar results. For example, the first layer 103 may comprise a material that has a negative dynamic conductivity. For example, the first layer 103 may comprise a single atomic layer or only a small number of atomic layers.

The relationship between the bias voltage V and the obtained Fermi energy $E_f$ for graphene is approximately $E_f = eV/2$ where e is the electron charge $1.6 \times 10^{-19}$ C.

Figure 9:
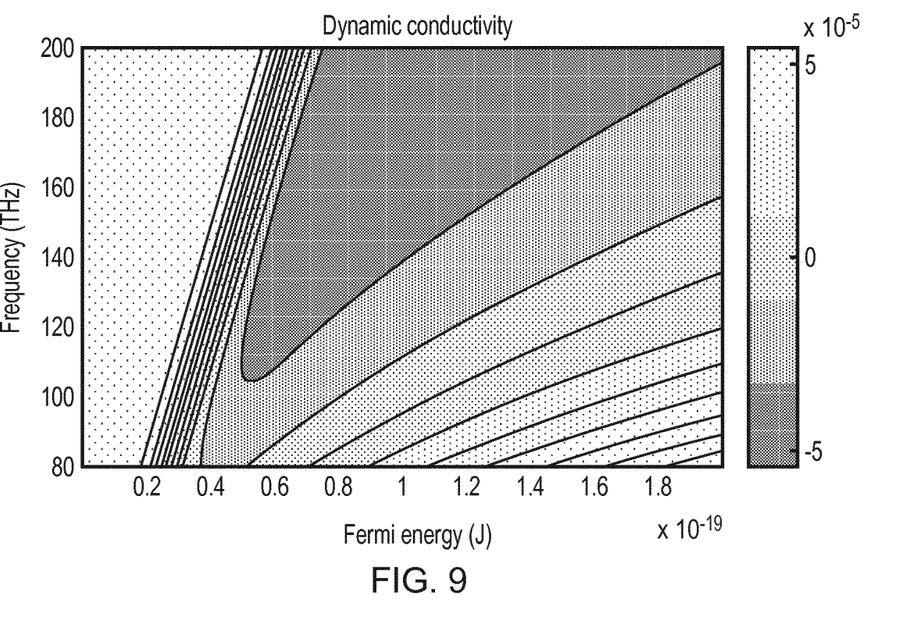
FIG. 9 illustrates how the dynamic conductivity of isolated graphene is dependent on both the Fermi Energy and the frequency of the electromagnetic radiation.

As illustrated in FIG. 9 the dynamic conductivity of isolated graphene is dependent on both the Fermi Energy and the frequency of the electromagnetic radiation. It will therefore be appreciated that by tuning the Fermi energy by controlling the bias voltage applied to the first layer 103, the magnitude of the dynamic conductivity can be maximised for particular frequencies.

In particular, FIG. 9 illustrates the feasibility of the solution for a range of wavelength/frequencies that is of interest for telecommunication, e.g. 191-196 THz (C band). In particular, it can be seen that, for the C band, a bias voltage of about 1V is sufficient to reach a large magnitude of the negative conductivity of graphene.

Figure 10A:
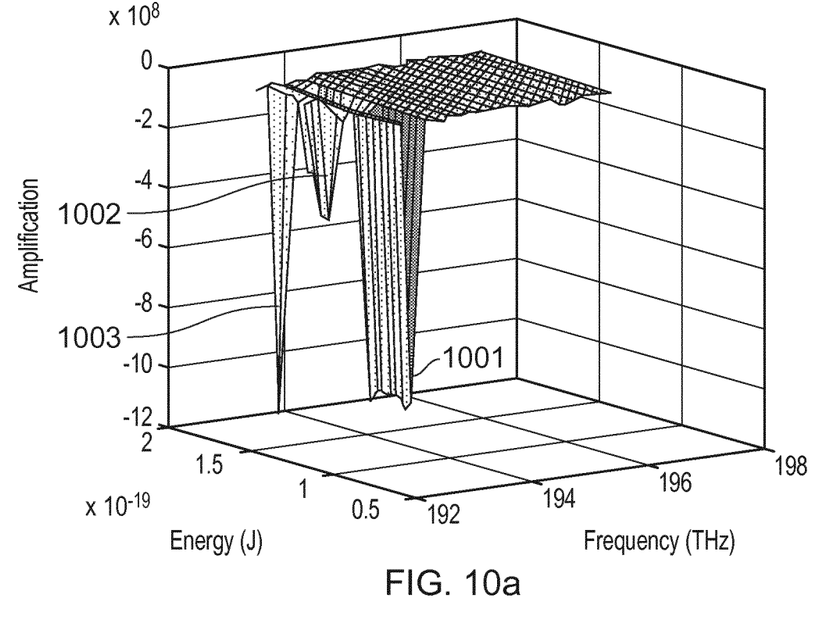
FIG. 10a illustrates the amplification provided by a graphene first layer, configured as illustrated in FIG. 6, over a period $a_{mod}$.
Figure 10B:
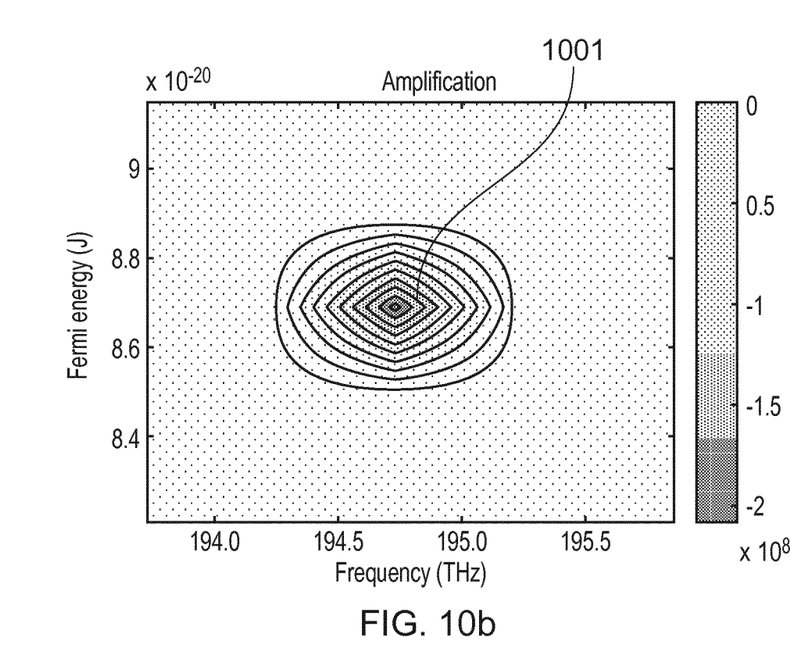
FIG. 10b illustrates the amplification provided by a graphene first layer, configured as illustrated in FIG. 6, over a period $a_{mod}$.

FIGS. 10a and 10b illustrate the amplification provided by a graphene first layer, configured as illustrated in FIG. 6, over a period $a_{mod}$.

In this example, the first set of electrical contacts 107 are of a width $I_1 = 0.25$ um and a depletion region width between the first set of contacts 107 is $d_1 = 1$ um, with reference to FIGS. 1 and 6. In this example, the core region 101 material is Silicon Dioxide and the cladding region 102 material is Silicon.

The depletion region, $d_1$, may have a larger area (i.e. a larger width as the height of the graphene strip is constant, d>21) than the total area of the doped regions. This may ensure the dominance of amplification in the depletion over the non-amplifying n and p regions.

In FIGS. 10a and 10b the amplification is expressed as negative absorption. As previously, the amplification is dependent on the Fermi Energy and the frequency of the incoming radiation. Therefore, as illustrated in FIGS. 10a and 10b a peak 1001 occurs at around a frequency of 193 THz, within the C band of interest.

In particular, FIG. 1b illustrates the detail of the resonance peak 1001.

The peaks towards the lower fermi energy values, 1002 and 1003 (illustrated in FIG. 10a), may be caused by other effects in the materials, for example, effects caused by the core region 101 and cladding region 102 materials as well as the first layer.

These simulations in FIGS. 10a and 10b illustrate the presence of a peak in the amplification (expressed as negative absorption) when the periodicity of the electrical contacts is such to satisfy the momentum matching conditions between the light propagating in the core, i.e. the 193 THz electromagnetic radiation, and the surface polariton wave. The maximum value of the amplification for the resonant frequency may depend on the Fermi energy that has been set by altering the voltage applied to the first set of electrical contacts 107.

As illustrated, the magnitude of the amplification, in the example in FIGS. 10a and 10b may be high, for example, the amplification may be larger than 10 dB. In some examples therefore, a voltage is applied to the first set of electrical contacts 107 such that the dynamic negative conductivity of the first layer 103 is at a maximum magnitude for the frequency of the surface polariton wave.

It may be difficult to estimate the phase noise from the numerical and analytical models. In particular, recombination in this scenario may have a characteristic time $t=10^{-12}$ s. However, for example, the spontaneous emission in graphene does not satisfy the momentum matching conditions in the range of wavelengths under consideration. Therefore, this spontaneous emission should not propagate along the interface, and will not therefore be amplified.

As embodiments described herein are based on a resonance mechanism, and the efficiency is peaked at a resonant frequency, embodiments described herein may be used for frequency selection in a similar manner as a Bragg grating. For this reason, tuning through temperature control (thermoelectric effect) is envisaged, using similar solutions as those applied to Bragg gratings. In other words, the frequencies of interest may be propagated and amplified along the first layer 103 utilizing the surface polariton waves and an appropriate voltage applied to the electrical contacts.

It will be appreciated that thermal noise may generate a broadening, for example a symmetric broadening, of the amplification peak 1001. A similar effect may be generated as a consequence of the fluctuation of the size of the first set of electrical contacts 108 due to fabrication tolerances.

Simulations demonstrate the feasibility of the solution for a range of wavelength/frequencies that is of interest for telecommunication, for example 191-196 THz (C band).

The accelerated electrons generated by the set of driving electrical contacts may travel ballistically when electrons are placed sufficiently close to each other. In graphene on Si substrate, this corresponds to some hundred microns. Such a distance is compliant with CMOS technology as fabrication tolerances allow the fabrication of slots having size down to 10 nm.

Accelerated electrons emit photons (which in the structure illustrated in FIG. 1 are bound to propagate as surface polariton waves) through Cherenkov radiation at an angle that is determined by the electron velocity. The electron velocity, v, is determined by the electric field, V, and the mobility of the material, µ, if scatterings are present, by:

$$v = \mu V \tag{14}$$

In graphene, the mobility is in the order of $10^3$ $V^{-1}$ $cm^2$ $s^{-1}$ to $10^4$ $V^{-1}$ $cm^2$ $s^{-1}$ for a SiO2 substrate. Therefore, for an electron velocity of the order of $3 \times 10^6$ m/s, as prescribed by the matching conditions for telecom frequencies, the required accelerating voltage would be ~0.3V. Higher voltages can be used to obtain multiple emissions: an electron can be accelerated, lose its energy via photon emission and be accelerated again a number of times if the accelerating field is strong enough to achieve fast acceleration of electrons.

In case of ballistic transport, where the electron experiences no collisions as in free space, the minimum value to accelerate the electron to the desired speed within a distance of 100 nm may be ~0.4V. In both cases therefore, the minimum range of applied voltages is similar.

Once the photon has been emitted, it propagates as a polariton surface wave at the interface between the core region 101 and the cladding region 102. The first layer of material is positioned at the interface or within an extinction length of the surface polariton wave from the interface.

The field associated to the surface polariton wave remains confined near the first layer 103. The first layer may be doped as described above to have a negative conductivity such that the propagating radiation is amplified. In this example, a depletion region is obtained between two regions of opposite doping. This may be achieved through carrier injection, where a gate of positive (negative) voltage is placed on first layer to produce a zone of negative (positive) doping underneath.

In some examples, the electro-optical apparatus 100 may be configured to provide amplification around the two wavelengths of interest for telecommunication 1310 nm and 1550 nm (O and C bands).

For example, the first layer 103 of the electro-optical apparatus 100 may be configured with a periodic refractive index of a second period along at least a third direction. This periodic refractive index of a second period may be provided with a second set of electrical contacts in a similar manner as the first set of electrical contacts. In other words, two periodic gate arrays may be provided on the first layer, one with the first period along a first direction and one with the second period along a different direction. One periodicity (although it will be appreciated that only one period of the changing refractive index may require to provide the phase matching) may be selected for matching with the O band the other may be selected for matching with C band radiation. The voltage applied to the set of driving electrical contacts 105 may be selected to direct the resulting surface polariton wave in the first direction or the third direction.

Alternatively, fine tuning of the gain peak as a function of the wavelength of the incoming electromagnetic radiation may be obtained through refractive index variation, induced by a local heater. A change in temperature may induce a local variation of the refractive index.

Phase matching for the Cherenkov emitted photon to travel as an interface polariton surface wave can be regulated through the gate voltage V. The same method can be used to adjust any phase mismatch or interference with that portion of light in the guiding medium that might not couple with the first layer 103.

In the example illustrated in FIG. 7, the polariton surface wave is excited in the direction perpendicular to the drift motion of emitting electrons. The first set of electrical contacts are positioned accordingly such that the changing refractive index is established in the direction perpendicular to the drift motion of the emitting electrons, and it is possible to transfer the radiation to the core region placed along that direction. This example has the advantage that the emission direction corresponds to $\theta_c = 0$, where the emission rate is maximum (see plot in FIG. 4).

However different geometries are possible where the polariton surface wave may be emitted at different angles and radiation may be transferred to a core region exploiting the same mechanism described above.

Figure 11:
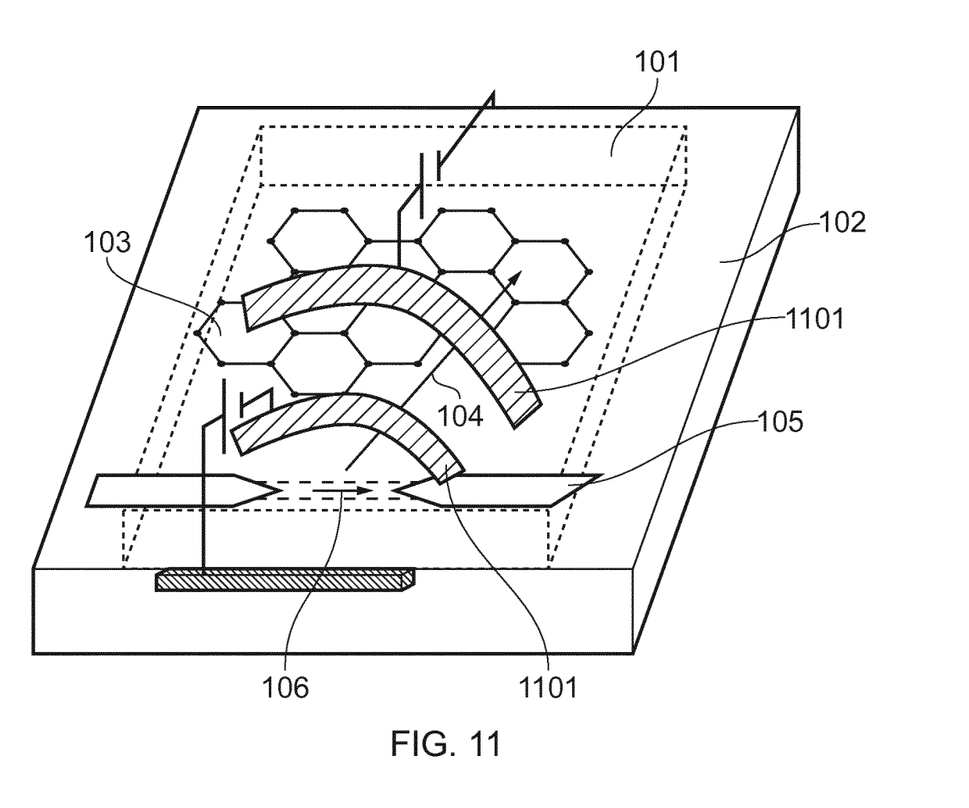
FIG. 11 illustrates an example of an electro-optical system having a curved first set of electrical contacts according to some embodiments.

FIG. 11 illustrates an example of an electro-optical system having a curved first set of electrical contacts 1101.

In this example the first layer 103 is further configured with a periodic refractive index of the first period along a fourth direction. In other words, the first set of electrical contacts may be configured to produce the same periodicity of refractive index along two different directions (in this example using a curved profile).

This example, may be used in applications such as wireless optical intra-chip communications. In this example, the direction of the surface polariton wave may be selected simply by regulating the voltage (about 1 V) applied to the driving electrical contacts 105. As the periodicity of the refractive index in the first layer 103 is the same in all the directions covered by the first set of curved electrical contacts 1101, the emitted surface polariton wave will propagate with the appropriate phase matching conditions in any of those directions, and may be transferred later into electromagnetic radiation in a core region 101 along any of the directions covered by the curved contacts 1101. For example, there may be a core region waveguide positioned along the direction 104.

Figure 12:
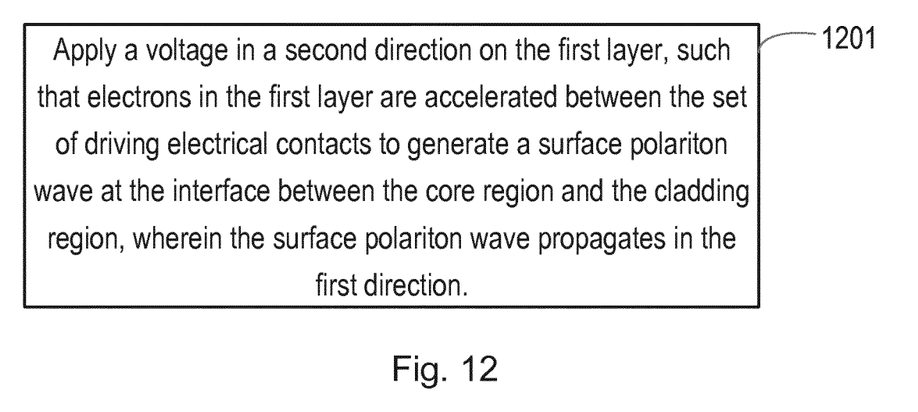
FIG. 12 illustrates a method of generating electromagnetic radiation in an electro-optical apparatus according to some embodiments.

FIG. 12 illustrates a method of generating electromagnetic radiation in an electro-optical apparatus. The electro-optical apparatus comprising a core region; a cladding region extending around the core region, and a first layer of a material extending along an interface between the core region and the cladding region, wherein the first layer is configured with a changing refractive index along at least a first direction. For example, the electro-optical apparatus may comprise an electro-optical apparatus 100 as described in any of the FIGS. 1 to 11.

In step 1201, the method comprises applying a voltage in a second direction on the first layer, such that electrons in the first layer are accelerated between the set of driving electrical contacts to generate a surface polariton wave at the interface between the core region and the cladding region, wherein the surface polariton wave propagates in the first direction. The thickness of the first layer is less than an extinction length of the surface polariton wave in the material, and the first layer is positioned a distance less than or equal to the extinction length of the surface polariton from the interface between the core region and the cladding region.

There is therefore provided an electro-optical apparatus for generating electromagnetic radiation without using electrical pumping, which is also suitable for production using CMOS techniques.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. An electro-optical apparatus for generating electromagnetic radiation, the electro-optical apparatus comprising:
   a core region;
   a cladding region extending around the core region;
   a first layer of a material extending along an interface between the core region and the cladding region, wherein the first layer is configured with a changing refractive index along at least a first direction; and
   a set of driving electrical contacts configured to apply a voltage in a second direction on the first layer, the second direction differing from the first direction, such that electrons in the first layer are accelerated between the set of driving electrical contacts to generate a surface polariton wave at the interface between the core region and the cladding region, wherein the surface polariton wave propagates in the first direction, and wherein
   a thickness of the first layer is less than an extinction length of the surface polariton wave in the material, and the first layer is positioned a distance less than or equal to the extinction length of the surface polariton wave from the interface between the core region and the cladding region.

2. The electro-optical apparatus as claimed in claim 1, wherein the surface polariton wave is generated by Cherenkov radiation.

3. The electro-optical apparatus as claimed in claim 1, wherein the changing refractive index comprises a periodic refractive index of a first period along at least the first direction.

4. The electro-optical apparatus as claimed in claim 3, wherein the first layer is configured with periodic carrier density variations to generate the periodic refractive index.

5. The electro-optical apparatus as claimed in claim 2, further comprising a first set of electrical contacts positioned to locally electrostatically dope the first layer to generate the periodic refractive index in the first layer.

6. The electro-optical apparatus as claimed in claim 5, wherein the first set of electrical contacts are positioned such that $a_{mod,1}=d_1+2l_1$, where $\alpha_{mod,1}$ is the period of modulation of the periodic refractive index, $d_1$ comprises a distance between two adjacent contacts of the first set of electrical contacts, and $l_1$ is a width of a contact in the first set of electrical contacts.

7. The electro-optical apparatus as claimed in claim 6, wherein a momentum of the surface polariton wave $k_{s,1}'$ is:

$$k_{s,1}' = \left(k_{s,1} + \frac{\omega m \lambda}{c a_{mod,1}}\right)$$

where $k_{s,1}$ is a momentum of a predicted surface polariton wave at the interface between the core region and the cladding region with no periodic refractive index in the first layer, and m is an integer value, $\omega$ is a frequency of the electromagnetic radiation of the first wavelength, c is the speed of light, and $\lambda$ is the first wavelength.

8. The electro-optical apparatus as claimed in claim 3, wherein the first layer is further configured with a periodic refractive index of a second period along at least a third direction, differing from the list direction, wherein the second period differs from the first period.

9. The electro-optical apparatus as claimed in claim 3, wherein the first layer is further configured with a periodic refractive index of the first period along a fourth direction, differing from the first direction.

10. The electro-optical apparatus as claimed in claim 1, wherein the first layer is placed at the interface.

11. The electro-optical apparatus as claimed in claim 1, wherein the set of driving electrical contacts are positioned so as to accelerate the electrons through an n doped region in the first layer.

12. The electro-optical apparatus as claimed in claim 1, wherein the distance between set of driving electrical contacts is less than the mean free path of the electrons.

13. The electro-optical apparatus as claimed in claim 1, wherein a momentum of the surface polariton wave equates to a momentum of electromagnetic radiation of a first wavelength propagating through the core region.

14. The electro-optical apparatus as claimed in claim 1, wherein the first layer is a layer of graphene.

15. The electro-optical apparatus as claimed in claim 1, wherein the material has a negative dynamic conductivity.

16. The electro-optical apparatus as claimed in claim 15, wherein a voltage is applied to the first set of electrical contacts such that the dynamic negative conductivity of the first layer is at a maximum magnitude for a wavelength of the surface polariton wave.

17. A method of generating electromagnetic radiation in an electro-optical apparatus comprising a core region, a cladding region extending around the core region, and a first layer of a material extending along an interface between the core region and the cladding region, wherein the first layer is configured with a changing refractive index along at least a first direction, the method comprising:

applying a voltage in a second direction on the first layer, the second direction differing from the first direction, such that electrons in the first layer are accelerated between the set of driving electrical contacts to generate a surface polariton wave at the interface between the core region and the cladding region, wherein the surface polariton wave propagates in the first direction, and wherein a thickness of the first layer is less than an extinction length of the surface polariton wave in the material, and the first layer is positioned a distance less than or equal to the extinction length of the surface polariton wave from the interface between the core region and the cladding region.

18. The method of claim 17, wherein the surface polariton wave is generated by Cherenkov radiation.

\* \* \* \* \*